US00RE45217E

(19) United States
(12) Reissued Patent
Ha et al.

(10) Patent Number: US RE45,217 E
(45) Date of Reissued Patent: Oct. 28, 2014

(54) SEMICONDUCTOR LIGHT EMITTING DEVICE WITH TRANSPARENT ELECTRODE HAVING HOLES

(75) Inventors: Jun-Seok Ha, Seoul (KR); Jun-Ho Jang, Gyeonggi-Do (KR); Jae-Wan Choi, Seoul (KR); Jung-Hoon Seo, Seoul (KR)

(73) Assignee: LG Electronics Inc., Seoul (KR)

(21) Appl. No.: 12/211,707

(22) Filed: Sep. 16, 2008

Related U.S. Patent Documents

Reissue of:
(64) Patent No.: 7,109,048
Issued: Sep. 19, 2006
Appl. No.: 10/950,470
Filed: Sep. 28, 2004

(30) Foreign Application Priority Data

Sep. 30, 2003 (KR) ..... 10-2003-0067802
Sep. 30, 2003 (KR) ..... 10-2003-0067968

(51) Int. Cl.
*H01L 21/00* (2006.01)

(52) U.S. Cl.
USPC ..... 438/22; 438/24; 438/46; 438/47; 257/79; 257/E33.001; 257/E33.062

(58) Field of Classification Search
USPC ..... 438/22, 24, 46, 47; 257/79, E33.001, 257/E33.062
See application file for complete search history.

(56) References Cited

U.S. PATENT DOCUMENTS 5,789,768 A 8/1998 Lee et al.
6,380,564 B1 * 4/2002 Chen et al. ..... 257/99
6,445,007 B1 * 9/2002 Wu et al. ..... 257/80
6,943,377 B2 9/2005 Gaska et al.
2003/0178626 A1 9/2003 Sugiyama et al.
2004/0079947 A1 4/2004 Lan et al.
2004/0106222 A1 6/2004 Steckl et al.
2004/0140473 A1 * 7/2004 Chen ..... 257/79

FOREIGN PATENT DOCUMENTS

JP 2000-349341 A 12/2000
KR 10-2003-0065884 A 8/2003
KR 10-2003-00757547 A 9/2003

* cited by examiner

*Primary Examiner* — Andy Huynh
(74) *Attorney, Agent, or Firm* — Birch, Stewart, Kolasch & Birch, LLP

(57) ABSTRACT

[A semiconductor light emitting device and a fabrication method thereof includes: providing a substrate; forming an n-type semiconductor layer, a light emitting layer, a p-type semiconductor layer on the substrate; forming a first transparent electrode having holes per a certain region on the p-type semiconductor layer; and forming a first pad on the first transparent electrode.] *A method of fabricating a semiconductor light emitting device, and which includes forming a light emitting layer on the first type semiconductor layer; forming a second type semiconductor layer on the light emitting layer; forming a first transparent electrode on the second type semiconductor layer, the first transparent electrode having holes per a certain region to thereby expose the second type semiconductor layer; forming a second transparent electrode on the first transparent electrode; forming a first pad on the second transparent electrode; and forming a second pad over the first type semiconductor layer. Further, the first transparent electrode is in the shape of columns with gaps therebetween on the second type semiconductor layer, and the second transparent electrode completely covers the first transparent electrode and fills the gaps of the first transparent electrode.*

4 Claims, 10 Drawing Sheets

SEMICONDUCTOR LIGHT EMITTING DEVICE WITH TRANSPARENT ELECTRODE HAVING HOLES

Matter enclosed in heavy brackets [ ] appears in the original patent but forms no part of this reissue specification; matter printed in italics indicates the additions made by reissue.

*This application is a reissue of U.S. Pat. No. 7,109,048 B2 issued on Sep. 19, 2006, and the entire contents of the patent are hereby incorporated by reference.*

This Nonprovisional application claims priority under 35 U.S.C. § 119(a) on patent application Ser. No(s). 10-2003-0067968 and 10-2003-0067802 filed in Korea, Republic of on Sep. 30, 2003, the entire contents of which are hereby incorporated by reference.

BACKGROUND OF THE INVENTION

1. Field of the Invention

The present invention relates to a semiconductor light emitting device, and more particularly, to a semiconductor light emitting device capable of maximizing an emission of light generated at a light emitting layer to outside and easily spreading a current to the light emitting layer, and a fabrication method thereof.

2. Description of the Related Art

Generally, a semiconductor is a direct transition type, and has been used to form a light emitting wavelength from a red region to a purple region and an ultraviolet ray region due to a high light emitting efficiency. As the understanding for a growing method and a structure of the semiconductor is increased, characteristics of a light emitting device, that is, a brightness, a driving voltage, or a static characteristic have been improved.

However, in spite of these efforts, a high output and a low driving voltage are much required, and a nitride semiconductor light emitting device that outputs a long wavelength (yellow and red) and a short wavelength (ultraviolet rays) has to be continuously researched. FIG. 1 shows a structure of a nitride semiconductor light emitting device in accordance with the conventional art.

As shown, the conventional nitride semiconductor light emitting device comprises: a sapphire substrate 10; an n-doped GaN layer 11 on the sapphire substrate 10; a light emitting layer 12; a p-GaN layer 13; a transparent electrode 14 formed on the p-GaN layer 13; a p-pad electrode 15 on the transparent electrode 14; and an n-pad electrode 16 formed on the n-GaN layer 11 exposed by vertically mesa-etching from the p-GaN layer 13 to a part of the n-GaN layer 11.

FIG. 2 is a view showing a structure of another nitride semiconductor light emitting device, that is, a Top-down electrode type semiconductor light emitting device in accordance with the conventional art. As shown, on a silicon carbide (SiC) substrate 20, an n-GaN layer 21, a light emitting layer 22, a p-GaN layer 23, and a transparent electrode 24 are sequentially formed. An n-pad electrode 26 is formed below the silicon carbide substrate 20, and a p-pad electrode 25 is formed on the transparent electrode 24.

In the conventional nitride semiconductor light emitting device, the transparent electrode lowers a driving voltage of a device by facilitating a current spread, and enhances a quantum efficiency by emitting light generated at a light emitting layer to outside. As the transparent electrode, a metal such as Ni or Au, or a TCO-based oxide such as ITO or IZO are used.

In case of using a metal such as Ni or Au as the transparent electrode, a current spread to the p-GaN layer can be facilitated by lowering an ohmic contact resistance of the p-GaN layer. However, a metal oxide generated at the time of depositing the transparent electrode prevents light generated from a light emitting layer from being emitted outwardly, thereby lowering a light transmittance.

Therefore, in order to increase the light transmittance, a TCO-based oxide such as ITO or IZO is used. However, in case of using the TCO-based oxide, a contact resistance between a P-type nitride semiconductor layer and a TCO electrode is very great thereby to increase a driving voltage.

The transparent electrode can be formed as a layer more than two by using a metal oxide generating metal such as Ni, Pd, Pt, etc. and a current spreading metal such as Au, etc. As the transparent electrode, Ni and Au are mainly used.

For example, a first metal layer is deposited on the p-GaN layer by using the metal oxide generating metal, Ni, and then a second metal layer is deposited on the first metal layer by using a current spreading metal, Au, thereby forming a transparent electrode.

At this time, a metal oxide such as NiO is formed as said Ni is oxidized. The metal oxide supplies a hole to the p-GaN layer.

However, since said metal oxide has an inferior conductivity, a spread of a current supplied from outside to the light emitting layer is prevented. According to this, it is necessary to prevent the metal oxide from being excessively formed.

However, in said general method, that is, in a method for forming a transparent electrode by depositing a metal layer more than two layers on a p-GaN by a separate deposition process, much metal oxide is entirely generated from an interface between the p-GaN layer and the metal layer to the uppest metal layer.

FIG. 3 schematically shows a sectional surface of a transparent electrode formed on a P-type nitride semiconductor in accordance with the conventional art. Referring to FIG. 3, GaN, III-V group compound is formed on a sapphire substrate, then Ni and Au are sequentially deposited on the p-doped GaN layer, and then a thermal annealing is performed to obtain a transparent electrode.

As shown, when the thermal annealing is performed after sequentially depositing Ni and Au, Au of an island shape is formed on the p-doped GaN layer 13 and the Ni is oxidized thereby to form an oxide metal. At this time, the metal oxide supplies a hole to a p-GaN layer, and said Au facilitates a spread of the hole supplied from the metal oxide to the light emitting layer.

FIG. 4 is a view showing a distribution of Au and NiO according to a thickness of a transparent electrode in accordance with the conventional art. In the experiment, a sapphire substrate was used as a substrate, a GaN, III-V group compound was used as a nitride semiconductor, Ni and Au were sequentially deposited on the p-doped GaN layer to form a transparent electrode, and a thickness of the transparent electrode was approximately 1 nm~100 nm. Also, a thermal annealing for forming the transparent electrode was performed at a temperature of approximately 600° C., and an allowance error range of the temperature in the thermal annealing was approximately ±100° C. At this time, the thermal annealing was performed in an atmosphere that a little amount of oxygen is mixed to nitrogen, and a rapid thermal annealing (RTA) device was used for the thermal annealing.

As shown from the graph, Au is concentrated on the surface of the P-GaN, and NiO is decreased from the surface thereof to the interface between the P-GaN. Also, on the surface of the P-GaN, Au and NiO are similarly distributed.

SUMMARY OF THE INVENTION

Therefore, an object of the present invention is to provide a nitride semiconductor light emitting device capable of maximizing an emission of light generated at a light emitting layer to outside, and a fabrication method thereof.

Another object of the present invention is to provide a nitride semiconductor light emitting device capable of facilitating a current spread to a light emitting layer of a semiconductor light emitting device, and a fabrication method thereof.

To achieve these and other advantages and in accordance with the purpose of the present invention, as embodied and broadly described herein, there is provided a fabrication method of a semiconductor light emitting device comprising: providing a substrate; sequentially forming an n-type semiconductor layer, a light emitting layer, a p-type semiconductor layer on the substrate; forming a first transparent electrode having holes per a certain region on the p-type semiconductor layer; and forming a first pad on the first transparent electrode.

To achieve these and other advantages and in accordance with the purpose of the present invention, as embodied and broadly described herein, there is also provided a semiconductor light emitting device comprising: an n-type semiconductor layer formed on the substrate; a light emitting layer formed on the n-type semiconductor layer; a p-type semiconductor layer formed on the light emitting layer; a first transparent electrode having holes per a certain region on the p-type semiconductor layer; and a first pad formed on the first transparent electrode.

According to another embodiment of the present invention, a fabrication method of a semiconductor light emitting device comprises: providing a substrate; sequentially forming an n-type semiconductor layer, a light emitting layer, a p-type semiconductor layer on the substrate; depositing a metal group that at least one metal oxide generating metal and at least one current spreading metal are mixed on the p-type semiconductor layer, and thereby forming a first transparent electrode; and forming a first pad on the p-type semiconductor layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a nitride semiconductor light emitting device and a fabrication method thereof according to the present invention will be explained with reference to the attached drawings.

FIGS. 5A to 5E are processing section views showing a fabrication method of a semiconductor light emitting device according to one embodiment of the present invention.

Figure 5A:
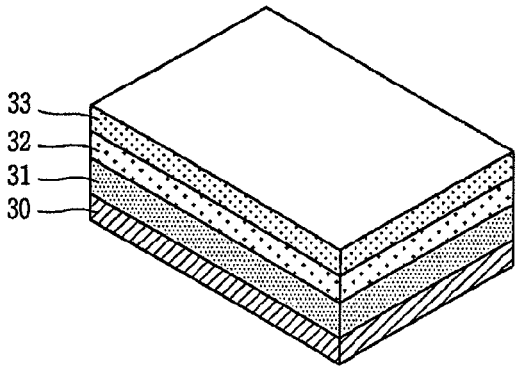
FIGS. 5A to 5E are processing section views showing a fabrication method of a semiconductor light emitting device according to one embodiment of the present invention.

As shown in FIG. 5A, according to one embodiment of the present invention, an n-type nitride semiconductor layer 31, a light emitting layer 32, and a p-type nitride semiconductor layer 33 are sequentially formed on a substrate 30.

That is, a nitride semiconductor layer is grown on the substrate 30 by using a metal organic vapor phase epitaxy growing method, etc. Then, an n-type impurity is doped thereby to form the n-type nitride semiconductor layer 31. Next, the light emitting layer 32 and a nitride semiconductor layer are sequentially deposited on the n-type nitride semiconductor layer 31, then the nitride semiconductor layer is grown with a certain thickness, and a p-type impurity is doped, thereby forming the p-type nitride semiconductor layer 33.

The substrate 30, a hetero-substrate may be formed of a sapphire substrate or a silicon carbide (SiC) substrate.

The n-type nitride semiconductor layer 31 can be formed with a thickness corresponding to 1 μm~500 μm, approximately. As the n-type impurity, one of Si, Ge, Se, S, Te, etc. can be selected.

The p-type nitride semiconductor layer 33 may be formed of GaN, AlGaN, and InGaN with a thickness corresponding to 0.1 μm~100 μm, approximately. As the p-type impurity, one of Be, Sr, Ba, Zn, Mg, etc. can be selected.

Figure 5B:
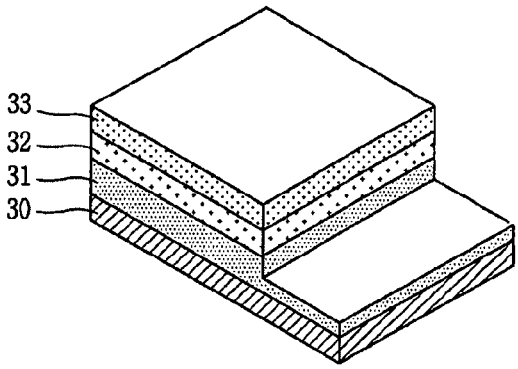

When the n-type nitride semiconductor layer 31, the light emitting layer 32, and the p-type nitride semiconductor layer 33 are sequentially formed on the substrate 30, a mesa etching is partially performed from the p-type nitride semiconductor layer 33 to the n-type nitride semiconductor layer 31 in a vertical direction. According to this, as shown in FIG. 5B, a part of the n-type nitride semiconductor layer 31 is exposed.

Figure 5C:
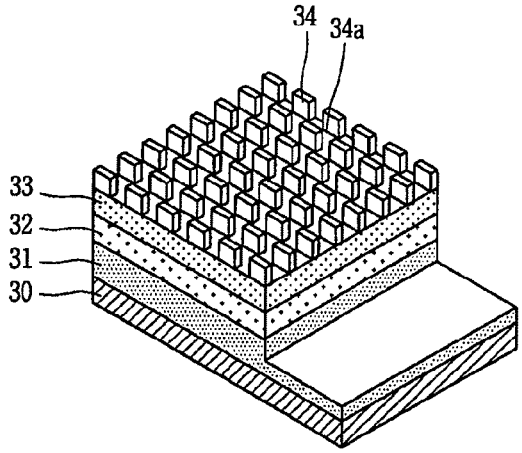

Then, on the p-type nitride semiconductor layer 33 that remains without being etched in said etching process, one transparent conductive metal of Ni, Au, Pd, Pt, Pu, Ir, etc. or a mixture of at least two therebetween is deposited thereby to form a single metal layer or a multi-metal layer. Then, the deposited metal layer is patterned thereby to form a first transparent electrode 34 having a plurality of holes 34a repeatedly-formed per a certain region, as shown in FIG. 5C. Herein, the term of 'transparent' denotes the time when a light transmittance is more than 10%, which does not denote no color or a transparency.

Figure 5D:
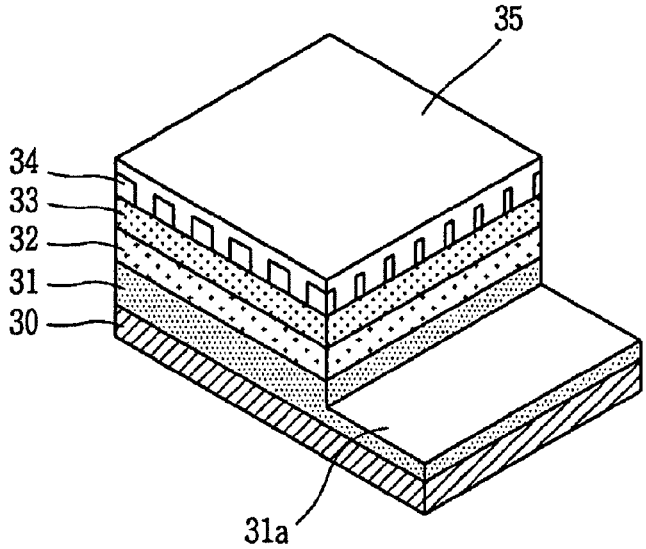

Then, as shown in FIG. 5D, a transparent conducting oxide (TCO)-based second transparent electrode 35 can be formed on the first transparent electrode 34 where the holes 34a are repeatedly patterned per a certain region. That is, the TCO-based oxide, for example, one oxide selected from a group of ITO, IZO, ZnO, AZO, CdO, MgO, etc. is deposited and thermally annealed thereby to form the second transparent electrode 35.

The second transparent electrode 35 is for enhancing an emission efficiency of light generated at the light emitting layer 32 thus to be emitted from the first transparent electrode 34 and the holes 34 to outside. That is, when light generated from the light generating layer 32 by a current supplied from outside is emitted to the second transparent electrode 35 through the first transparent electrode 34 and the hole 34a, an outside area that the emitted light can reach is obtained to the maximum thereby to facilitate an emission of the light to outside.

Finally, on the respective second transparent electrode 35 and the exposed n-type nitride semiconductor layer 31a, one of Ni, Cr, Al, Au, Pt, Ti, etc. or a mixture of at least two therebetween is deposited and then is patterned. According to this, as shown in FIG. 5E, a first pad 36 for electrically connecting the second transparent electrode 35 to an external terminal, and a second pad 37 for electrically connecting the exposed n-type nitride semiconductor layer 31a to an external terminal are respectively formed.

When the second transparent electrode 35 is not formed, the first pad 36 is formed on the first transparent electrode 34. In the present invention, the second transparent electrode 35 can be formed or can not be formed.

Figure 5E:
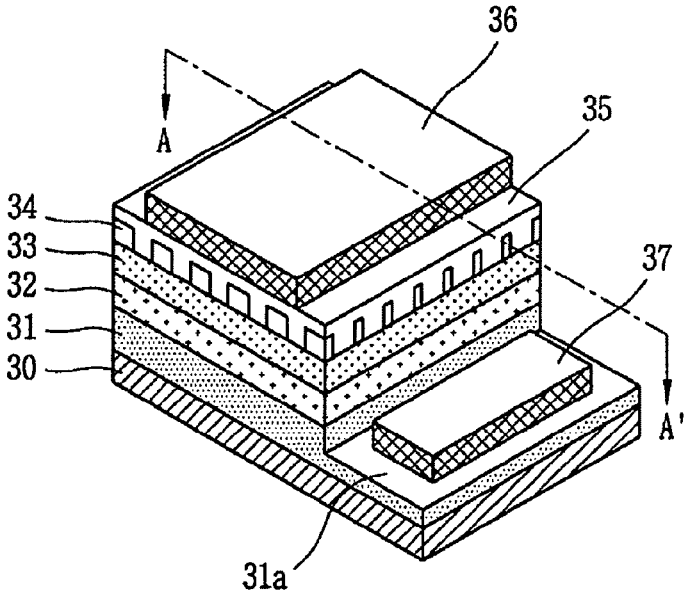
Figure 6:
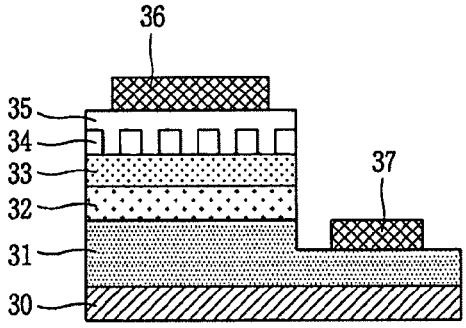
FIG. 6 is a view taken along line A-A of FIG. 5E.

FIG. 6 is a view taken along line A-A of FIG. 5E, which shows a nitride semiconductor light emitting device fabricated according to the first embodiment of the present invention.

As shown, the nitride semiconductor light emitting device according to the present invention comprises: a substrate 30; an n-type nitride semiconductor layer 31 formed on the substrate 30; a light emitting layer 32 formed on the n-type semiconductor layer 31; a p-type semiconductor layer 33 formed on the light emitting layer 32; a first transparent electrode 34 formed as a transparent electrode forming metal is deposited on the p-type semiconductor layer 33 and then is patterned so that holes are repeatedly formed per a certain region; a second transparent electrode 35 formed on the first transparent electrode 34; and first and second pads 36 and 37 respectively formed on the second transparent electrode 35 and the n-type semiconductor layer 31.

Since the first transparent electrode 34 is formed of a transparent conductive metal, an ohmic contact resistance of the p-type nitride semiconductor layer 33 is lowered thereby to facilitate a spread of a current supplied from an external power source thus to be transmitted to the first transparent electrode 34 through a pad electrode formed in the later process to the light emitting layer 32.

Therefore, when compared to the conventional art in which the TCO electrode is used as a transparent electrode, in the present invention, a driving voltage can be more lowered since a contact resistance between the p-type nitride semiconductor layer and the TCO electrode is less. That is, in the present invention, since a current spread to the light emitting layer can be facilitated, a spread of the same amount of current to the light emitting layer can be performed even with a driving voltage lower than the conventional driving voltage.

Also, in the present invention, holes are formed per a certain region on the transparent electrode, so that a light transmittance can be more increased when compared to the conventional case that Ni and Au are used. That is, in the conventional art, the hole region is not formed. Therefore, when a certain amount of current is supplied to the light emitting layer, a metal oxide generated on the transparent electrode layer shields a part of light generated from the light emitting layer thus to be emitted to outside thereby to lower a light transmittance. On the contrary, in the present invention, even if a metal oxide for shielding a light emission is generated on the transparent electrode layer, a light transmittance to outside can be increased since holes are formed per a certain region on the transparent electrode layer.

That is, in the present invention, in order to prevent a phenomenon that light emitted outwardly is decreased since a light transmittance is lowered due to a metal constituting the first transparent electrode, an area occupied by a metal at the first transparent electrode is minimized with maintaining an ohmic contact and holes are formed at the rest part for a light transmittance. According to this, light can be easily emitted upwardly.

In the present invention, a transparent conductive metal is deposited on the p-type nitride semiconductor layer deposited on the light emitting layer, and then is patterned thereby to form the first transparent electrode having a plurality of holes. According to this, a current supplied from outside can be easily spread to the light emitting layer through a pad electrode formed in the later process, and light generated from the light emitting layer can be easily emitted to outside through the hole formed per a certain region.

The present invention can be also applied to a Top-down electrode type semiconductor light emitting device where a silicon carbide (SiC) substrate is used.

FIGS. 7A to 7D are processing section views showing a fabrication method of a semiconductor light emitting device according to a second embodiment of the present invention applied to a Top-down electrode type semiconductor light emitting device.

Figure 7A:
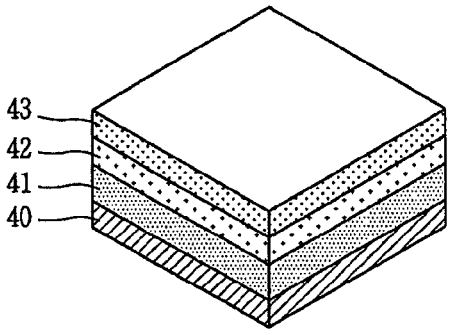
FIGS. 7A to 7D are processing section views showing a fabrication method of a semiconductor light emitting device according to a second embodiment of the present invention.

As shown in FIG. 7A, according to the second embodiment of the present invention, an n-type nitride semiconductor layer 41, a light emitting layer 42, and a p-type nitride semiconductor layer 43 are sequentially formed on a substrate 40.

That is, a nitride semiconductor layer is grown on the substrate 40 by using a metal organic vapor phase epitaxy growing method, etc. Then, an n-type impurity is doped thereby to form the n-type nitride semiconductor layer 41. Next, the light emitting layer 42 and a nitride semiconductor layer are sequentially deposited on the n-type nitride semiconductor layer 41, then the nitride semiconductor layer is grown with a certain thickness, and a p-type impurity is doped, thereby forming the p-type nitride semiconductor layer 43.

The substrate 40, a hetero-substrate may be formed of a silicon carbide (SiC) substrate.

Figure 7B:
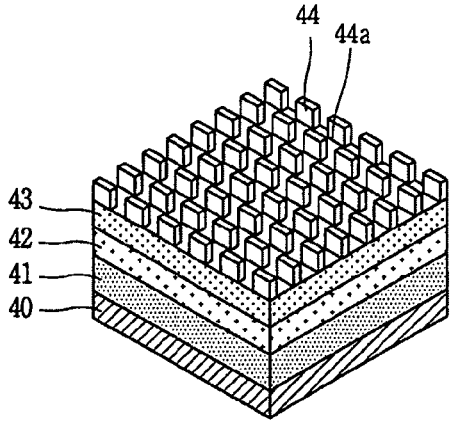

Then, on the p-type nitride semiconductor layer 43, one transparent conductive metal of Ni, Au, Pd, Pt, Pu, Ir, etc. or a mixture of at least two therebetween is deposited thereby to form a single metal layer or a multi-metal layer. Then, the deposited metal layer is patterned thereby to form a first transparent electrode 44 having a plurality of holes 44a repeatedly-formed per a certain region, as shown in FIG. 7B.

Figure 7C:
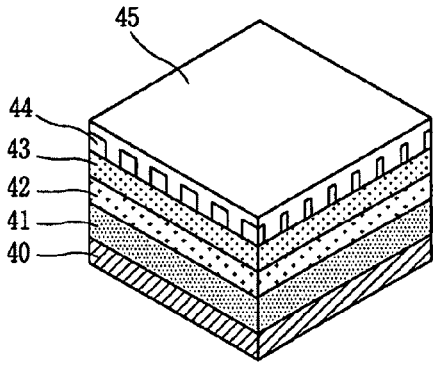

Then, as shown in FIG. 7C, a transparent conducting oxide (TCO)-based second transparent electrode 45 is formed on the first transparent electrode 44. That is, the TCO-based oxide, for example, one oxide selected from a group of ITO, IZO, ZnO, AZO, CdO, MgO, etc. is deposited on the first transparent electrode 44 and thermally annealed at a temperature of 400° C.~1000° C. thereby to form the second transparent electrode 45.

Figure 7D:
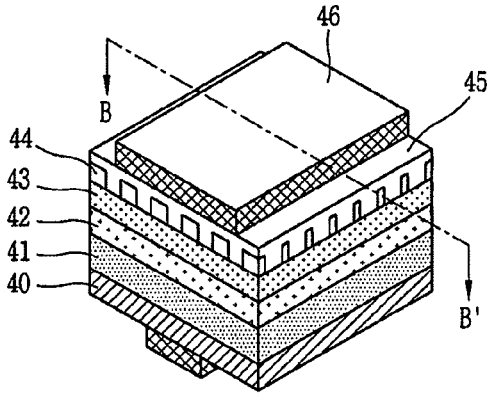

Then, as shown in FIG. 7D, on the second transparent electrode 45 and on the rear surface of the substrate 40, one of Ni, Cr, Al, Au, Pt, Ti, etc. or a mixture of at least two therebetween is deposited and then is patterned. According to this, as shown in FIG. 5E, a first pad 46 for electrically connecting the second transparent electrode 45 to an external terminal, and a second pad 47 for electrically connecting the substrate 40 to an external terminal are respectively formed.

Figure 8:
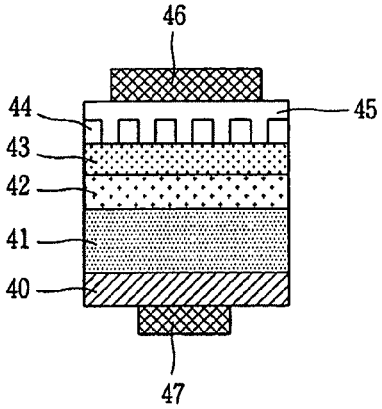
FIG. 8 is a view taken along line B-B of FIG. 7D.

FIG. 8 is a view taken along line B-B of FIG. 7D, which shows a semiconductor light emitting device fabricated according to the second embodiment of the present invention.

As shown, the semiconductor light emitting device according to the second embodiment of the present invention comprises: a substrate 40 formed of a silicon carbide (SiC), etc.; an n-type semiconductor layer 41 formed on the substrate 40; a light emitting layer 42 formed on the n-type semiconductor layer 41; a p-type semiconductor layer 43 formed on the light emitting layer 42; a first transparent electrode 44 formed as a transparent electrode forming metal is deposited on the p-type semiconductor layer 43 and then is patterned so that holes are repeatedly formed per a certain region; a plate-type second transparent electrode 45 formed on the first transparent electrode 44; and first and second pads 46 and 47 respectively formed on the second transparent electrode 45 and on the rear surface of the substrate 40.

As aforementioned in the first and second embodiments of the present invention, a transparent electrode that facilitates a current spread to the light emitting layer is formed on the p-type semiconductor layer thereby to reduce a contact resistance of the p-type semiconductor layer. According to this, a driving voltage can be more lowered when compared to the conventional art where a TCO-based transparent electrode is used. Also, the transparent electrode is patterned thus to form a plurality of holes that expose a part of the p-type semiconductor layer, thereby increasing a light transmittance that light generated from the light emitting layer is emitted to outside. According to this, when compared to the conventional light emitting device where a conductive metal such as Ni, Au, etc. is used as a transparent electrode, a light emitting efficiency of the light emitting device of the present invention can be more increased.

In the first and second embodiments of the present invention, the n-type semiconductor layer, the light emitting layer, and the p-type semiconductor layer are formed of a nitride semiconductor. However, the present invention is not limited to the nitride semiconductor. That is, the present invention can include all light emitting devices that the transparent electrode formed on the p-type semiconductor is formed of a conductive metal having a plurality of holes.

The present invention is to provide a semiconductor light emitting device capable of facilitating a current spread to the light emitting layer from the transparent electrode by greatly reducing a contact resistance between the p-type semiconductor layer and the transparent electrode.

That is, in case of forming the transparent electrode on the p-type semiconductor layer by sequentially depositing Ni and Au in accordance with the conventional art, NiO formed as said Ni is oxidized has an inferior conductivity thereby to shield a spread of a current supplied from outside to the light emitting layer.

According to this, in the present invention, Ni and Au are simultaneously deposited thus to prevent the metal oxide NiO from being excessively formed, thereby minimizing a restraint of a current spread to the light emitting layer due to the metal oxide.

FIGS. 9A to 9D are processing section views showing a fabrication method of a semiconductor light emitting device according to a third embodiment of the present invention to increase an ohmic characteristic between the p-type nitride semiconductor layer and the transparent electrode formed thereon.

Figure 9A:
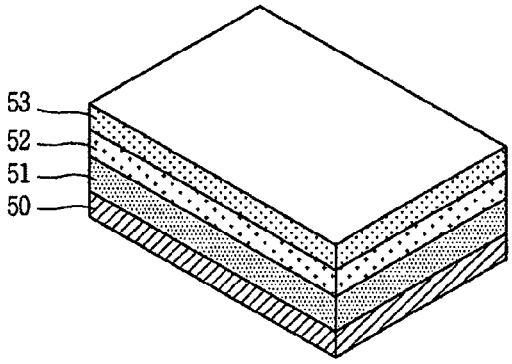
FIGS. 9A to 9D are processing section views showing a fabrication method of a semiconductor light emitting device according to a third embodiment of the present invention.

As shown in FIG. 9A, first, a sapphire substrate 50 is prepared. Then, a nitride semiconductor is grown on the substrate 50 with a certain thickness by using a metal organic vapor phase epitaxy growing method, etc. Then, an n-type impurity is doped thereby to form an n-type semiconductor layer 51. Next, a light emitting material and a nitride semiconductor layer are sequentially deposited on the n-type semiconductor layer 51, then a p-type impurity is doped on the nitride semiconductor thereby to form a p-type semiconductor layer 53.

The n-type semiconductor layer 51 can be formed with a thickness corresponding to 1 μm~500 μm, approximately. As the n-type impurity, one of Si, Ge, Se, S, Te, etc. can be selected. The p-type semiconductor layer 53 may be formed with a thickness corresponding to 0.1 μm~100 μm, approximately. As the p-type impurity, one of Be, Sr, Ba, Zn, Mg, etc. can be selected.

Figure 9B:
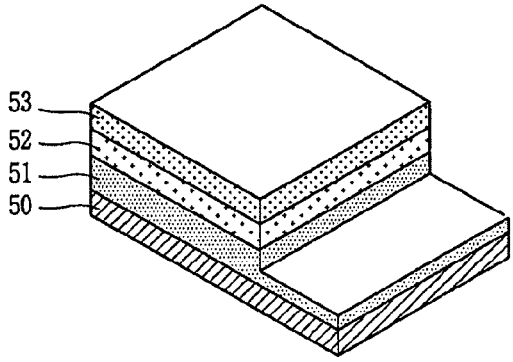

As shown in FIG. 9B, a mesa etching is partially performed from the p-type semiconductor layer 53 to the n-type semiconductor layer 51 in a vertical direction, thereby exposing a part of the n-type semiconductor layer 51.

Figure 9C:
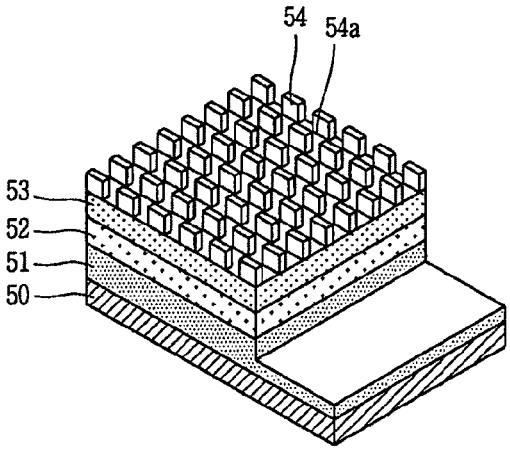

Then, a metal group that at least one metal oxide generating metal and at least one current spreading metal are mixed is deposited on the p-type semiconductor layer 53, thereby forming a transparent electrode 54 as shown in FIG. 9C.

That is, the transparent electrode 54 is formed by depositing a metal group that at least one metal oxide generating metal such as Ni, Pd, Pt, Pu, Ir, Zn, Mg and at least one current spreading metal such as Au are mixed on the p-type semiconductor layer 53. At this time, it is the most preferable to deposit a metal group that Ni and Au are mixed. Then, a thermal annealing was performed in an atmosphere that a little amount of oxygen is mixed to nitrogen at a temperature of 400° C.~1000° C., thereby facilitating an ohmic contact between the p-type semiconductor layer 53 and the transparent electrode 54.

It is also possible to pattern the transparent electrode 54 thereby to form a plurality of holes 54a that expose a part of the p-type semiconductor layer 53.

As aforementioned in the first and second embodiments of the present invention, the holes 54a minimize a shield of light generated from the light emitting layer 52 by the transparent electrode 54, and enhance a light emission to outside. In the preferred embodiment, the holes can be formed or can not be formed. However, in case of forming the holes at the transparent electrode 54, a light transmittance can be more increased than a case that the holes are not formed.

Figure 9D:
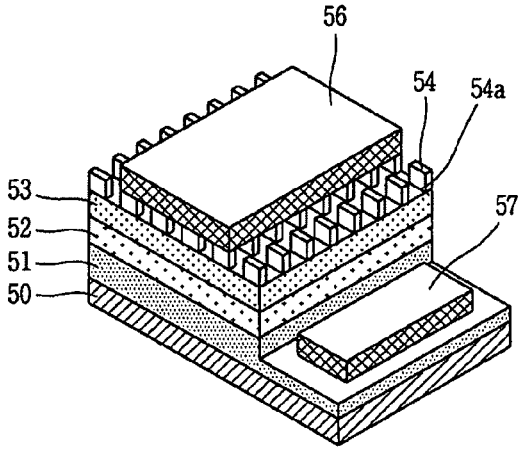

As shown in FIG. 9D, on the transparent electrode 54 and on the rear surface of the substrate 50, one of Ni, Cr, Al, Au, Pt, Ti, etc. or a mixture of at least two therebetween is deposited and then is patterned. According to this, a first pad 56 for electrically connecting the transparent electrode 55 to an external terminal, and a second pad 57 for electrically connecting the exposed n-type nitride semiconductor layer 51 a to an external terminal are respectively formed.

Although not shown, a TCO-based transparent electrode can be further formed on the transparent electrode. In this case, the first and second pads are formed on the TCO-based transparent electrode.

The fabrication method of a semiconductor light emitting device for forming a transparent electrode by simultaneously depositing a metal oxide generating metal and a current spreading metal on the p-type nitride semiconductor layer can be applied to a fabrication method of a Top-down electrode type semiconductor light emitting device.

Figure 10A:
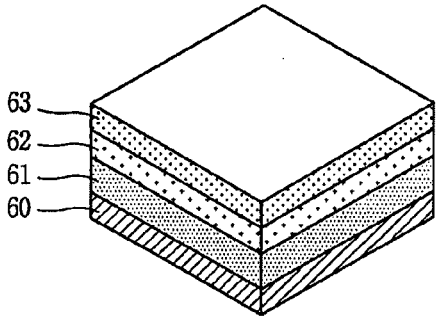
FIGS. 10A to 10C are processing section views showing a fabrication method of a semiconductor light emitting device according to a fourth embodiment of the present invention.
Figure 10B:
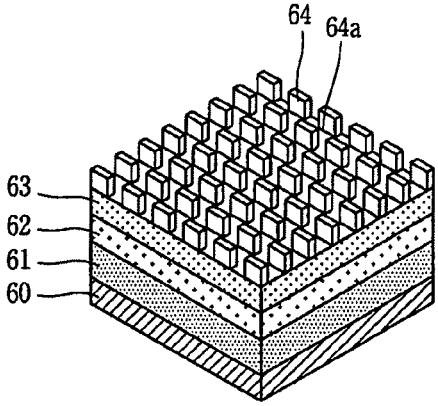
Figure 10C:
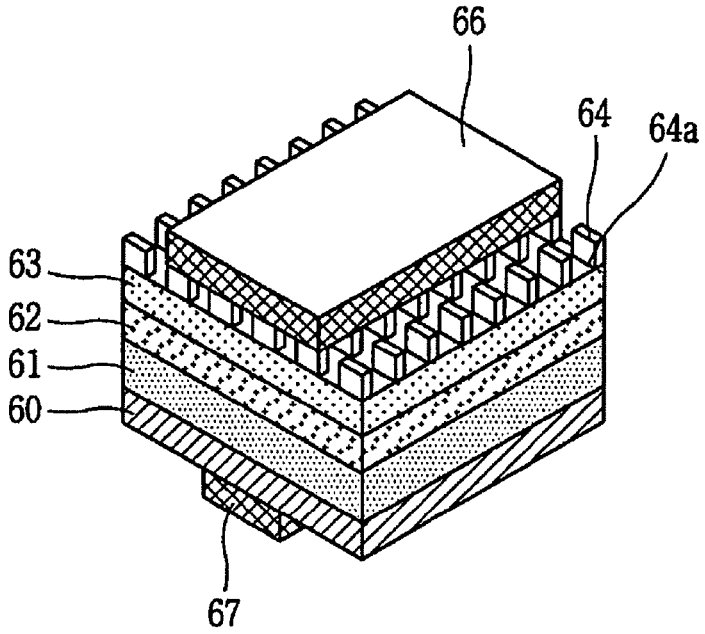

FIGS. 10A to 10C are processing section views showing a fabrication method of a Top-down electrode type semiconductor light emitting device according to a fourth embodiment of the present invention.

As shown in FIG. 10A, an n-type semiconductor layer 61, a light emitting layer 62, and a p-type semiconductor layer 63 are sequentially formed on a substrate 60. Said process is the same as that of the third embodiment.

Then, a metal group that at least one metal oxide generating metal such as Ni, Pd, Pt, Pu, Ir, Zn, Mg and at least one current spreading metal such as Au are mixed is deposited on the p-type semiconductor layer 63, thereby forming a transparent electrode 64 as shown in FIG. 10B. At this time, it is the most preferable to form the transparent electrode 64 by depositing a metal group that Ni and Au are mixed and by performing a thermal annealing in an atmosphere such as nitrogen or oxygen at a temperature of 300° C.~1000° C.

The transparent electrode 64 can be fabricated as various shapes such as a stripe shape or a mesh stripe shape. In the present invention, the shape of the transparent electrode 64 is not limited to a specific one.

It is also possible to form the hole 64a that exposes a part of the p-type semiconductor layer 63 by patterning the transparent electrode 64 like in the aforementioned embodiment.

Finally, as shown in FIG. 10C, on the transparent electrode 64 and on the rear surface of the substrate 60, one of Ni, Au, Pt, Ti, etc. or a mixture of at least two therebetween is deposited and then is patterned. According to this, a first pad 66 for electrically connecting the transparent electrode 64 to an external terminal, and a second pad 67 for electrically connecting the substrate 60 to an external terminal are respectively formed.

Although not shown, a TCO-based transparent electrode can be further formed on the transparent electrode. In this case, the first and second pads are formed on the TCO-based transparent electrode.

In the third and fourth embodiments of the present invention, a metal group that at least one metal oxide generating metal and at least one current spreading metal are mixed is deposited on the p-type semiconductor layer thereby to form the transparent electrode. At the time of depositing the metal group, an interface between the p-type semiconductor layer and the transparent electrode is oxidized, and thereby a metal oxide for supplying a hole to a p-GaN layer is generated on the p-type semiconductor layer. At this time, due to more active oxidization on the surface of the metal group, a metal oxide is relatively less generated at the periphery of the interface when compared to the conventional art.

That is, if the transparent electrode is formed by depositing a certain metal group on the p-type semiconductor layer according to the third and fourth embodiments, a metal oxide generating metal constituting the metal group, for example, Ni is evenly distributed from the surface of the p-type semiconductor layer to the uppermost part of the transparent electrode. According to this, the metal oxide can be more easily formed when compared to the conventional art.

Also, since a metal oxide is relatively less generated at the periphery of the interface between the p-type semiconductor layer and the transparent electrode when compared to the conventional art, a value of an ohmic contact resistance becomes relatively less when compared to the conventional art thereby to facilitate an ohmic contact.

Figure 11:
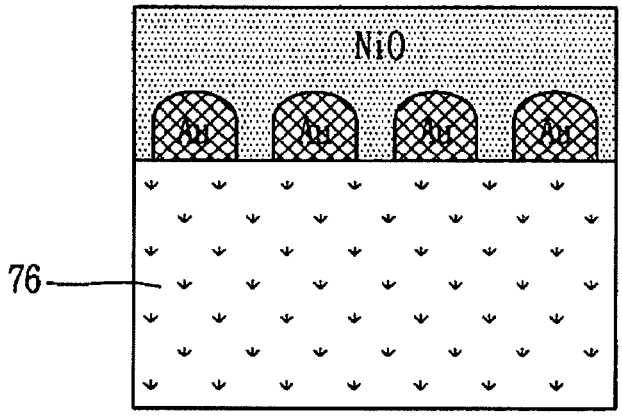
FIG. 11 is a view schematically showing a structure of a transparent electrode of a semiconductor light emitting device according to the present invention.

FIG. 11 is a view schematically showing a section structure of a transparent electrode formed on a p-type nitride semiconductor according to the third and fourth embodiments of the present invention.

First, GaN, III-V group compound is formed on a sapphire substrate or an SiC substrate. Next, a metal group that Ni and Au are mixed is deposited on the p-doped GaN layer, and then a thermal annealing is performed, thereby obtaining a transparent electrode.

Figure 1:
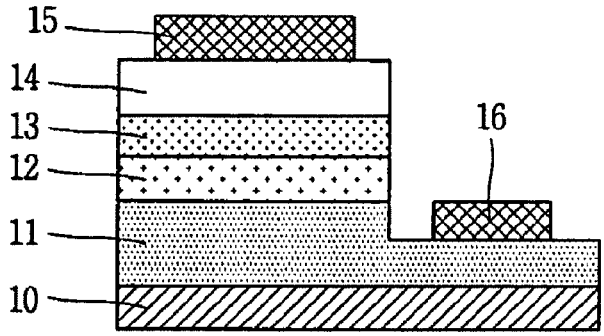
FIG. 1 RELATED ART
FIGS. 1 and 2 show one embodiment of a nitride semiconductor light emitting device in accordance with the conventional art.
Figure 2:
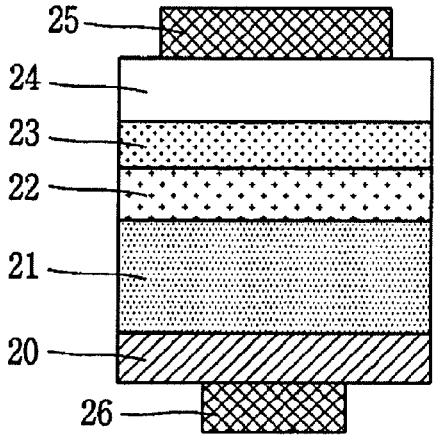
FIG. 2 RELATED ART
Figure 3:
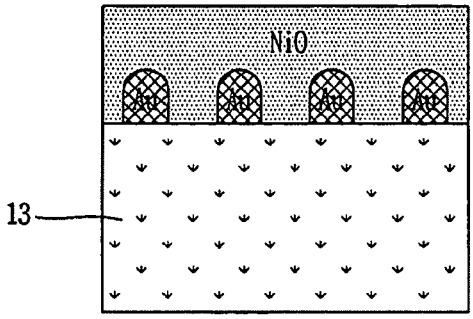
FIG. 3 RELATED ART
FIG. 3 is a graph schematically showing a structure of a transparent electrode of the nitride semiconductor light emitting device in accordance with the conventional art.

As shown, if a metal group that Ni and Au are mixed is deposited and then a thermal annealing is performed, Au of an island shape is formed on the p-doped GaN layer 76 and NiO is formed on the Au. When compared to the conventional structure (Refer to FIG. 3), in the present invention, Au is more formed on the surface of the P-GaN 76, and NiO is less formed on the surface of the P-GaN 76.

As aforementioned in the conventional art, the metal oxide NiO supplies a hole to the p-GaN 73, and the Au facilitates a spread of the hole supplied from the metal oxide to the light emitting layer. The fact that the contact area between the P-GaN and the Au was increased means that a current spread was more briskly performed when compared to the conventional art.

Figure 12:
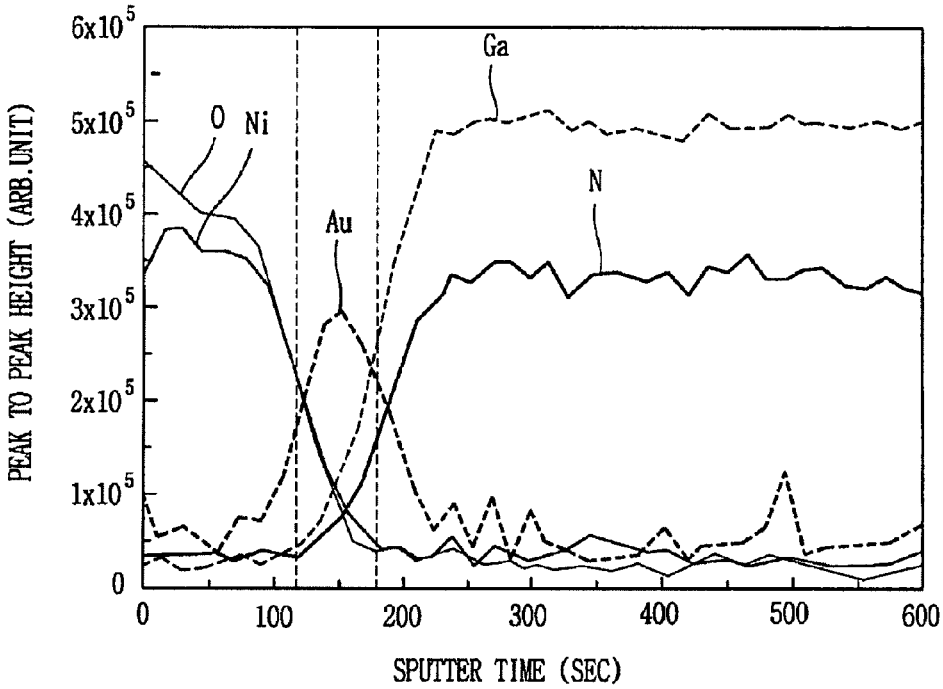
FIG. 12 is a graph showing a distribution of Au and NiO formed on a p-type semiconductor according to the present invention.

FIG. 12 is a graph showing a distribution of Au and NiO according to a thickness of a transparent electrode according to the third and fourth embodiments of the present invention. In the experiment, a sapphire substrate was used as a substrate, a GaN, III-V group compound was used as a nitride semiconductor, a metal group that Ni and Au are mixed was deposited on the p-doped GaN layer to form a transparent electrode, and a thickness of the transparent electrode was approximately 1 nm~100 nm. Also, a thermal annealing for forming the transparent electrode was performed at a temperature of approximately 600° C., and an allowance error range of the temperature in the thermal annealing was approximately ±100° C. At this time, the thermal annealing was performed in an atmosphere that a little amount of oxygen is mixed to nitrogen, and a rapid thermal annealing (RTA) device was used for the thermal annealing.

As shown from the graph, Au is concentrated on the surface of the P-GaN, and NiO is decreased from the surface thereof to the interface between the P-GaN and the NiO. At the interface between the P-GaN and the NiO, the NiO is less distributed than the Au.

Figure 4:
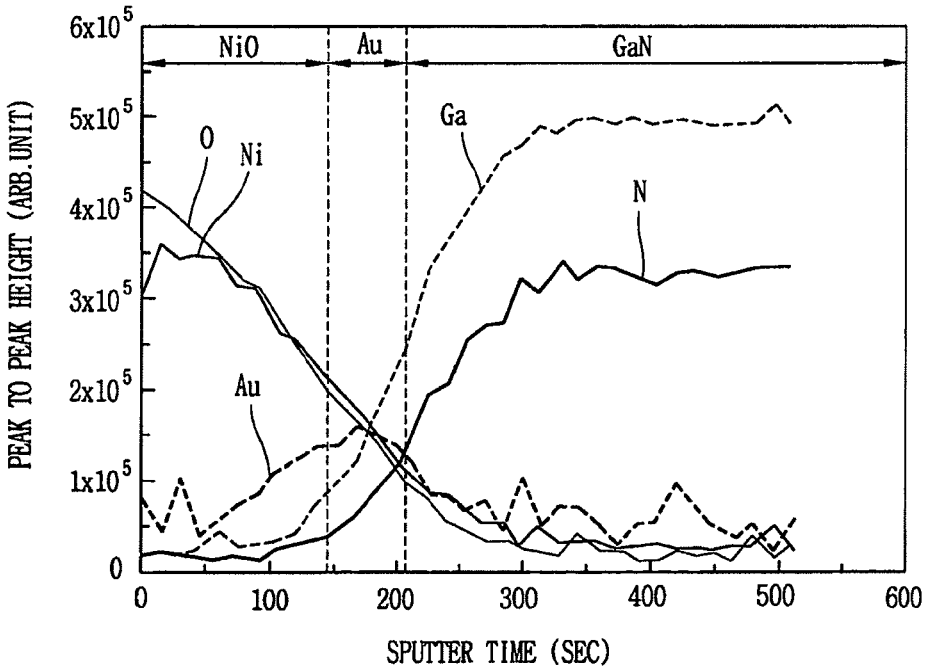
FIG. 4 RELATED ART
FIG. 4 is a view showing a distribution of Au and NiO formed on a P-type semiconductor in accordance with the conventional art.

That is, when compared to the conventional drawing (refer to FIG. 4), in the semiconductor light emitting device according to the present invention, a metal oxide, NiO that is not required any longer if a certain amount thereof is satisfied is relatively less formed at the interface between the p-GaN layer. The more the metal oxide, NiO is generated, the more a current spread to the light emitting layer is restrained thereby to increase a driving voltage of a device and to reduce a lifespan of the device. However, in the present invention, the metal oxide, NiO is less generated at the interface between the P-GaN layer, thereby lowering a driving voltage of the device and increasing a lifespan of the device.

As aforementioned, in the nitride semiconductor light emitting device and the fabrication method thereof according to the third and fourth embodiments of the present invention, a metal oxide can be easily formed at the time of depositing a transparent electrode. Also, an excessive generation of the metal oxide is restrained thereby to facilitate a current spread to the light emitting layer. According to this, a driving voltage of the device is lowered and thus a lifespan of the device is increased.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

[1. A fabrication method of a semiconductor light emitting device comprising:

providing a substrate;

forming an n-type semiconductor layer, a light emitting layer, and a p-type semiconductor layer on the substrate;

forming a first transparent electrode on the p-type semiconductor layer, said first transparent electrode having holes per a certain region to thereby expose the p-type semiconductor layer;

forming a first pad on the first transparent electrode; and forming a second transparent electrode on the first transparent electrode.]

[2. The method of claim 1, wherein the providing the substrate is performed by providing a sapphire substrate.]

[3. The method of claim 2, further comprising:

performing a mesa-etching from the p-type semiconductor layer to the n-type semiconductor layer partially in a vertical direction, and thereby exposing a part of the n-type semiconductor layer; and forming a second pad on the exposed n-type semiconductor layer.]

[4. The method of claim 1, wherein the providing the substrate is performed by providing a silicon carbide substrate.]

[5. The method of claim 4 further comprising forming the second pad on a rear surface of the silicon carbide substrate.]

[6. The method of claim 1, wherein the forming a first transparent electrode is performed by selecting one from a group composed of Ni, Au, Pd, Pt, Ir, Zn, and Mg or by forming a mixture of at least two therebetween.]

[7. The method of claim 1, wherein the forming the first transparent electrode comprises:

forming a first metal layer by depositing a metal group that at least one metal oxide generating metal and at least one current spreading metal are mixed on the p-type semiconductor layer; and annealing the first metal layer.]

[8. The method of claim 7, wherein the metal oxide generating metal is one selected from a group composed of Ni, Pd, Pt, Ir, Zn, and Mg, or a mixture of at least two therebetween.]

[9. The method of claim 7, wherein the current spreading metal is Au.]

[10. The method of claim 1, wherein the holes comprise empty spaces between pillars of the first transparent electrode.]

[11. The method of claim 1, further comprising forming a second transparent electrode on the first transparent electrode.]

[12. The method of claim 1, wherein the second transparent electrode is formed of one selected from a group composed of ITO, IZO, ZnO, AZO, CdO and MgO.]

[13. A fabrication method of a semiconductor light emitting device comprising:

providing a substrate;

forming an n-type semiconductor layer, a light emitting layer, a p-type semiconductor layer on the substrate;

forming a first transparent electrode having holes per a certain region on the p-type semiconductor layer;

forming a first pad on the first transparent electrode; and forming a second transparent electrode on the first transparent electrode, wherein the forming a first transparent electrode comprises:

forming a first metal layer by depositing a metal group that at least one metal oxide generating metal and at least one current spreading metal are mixed on the p-type semiconductor layer; and annealing the first metal layer.]

[14. The method of claim 13, wherein the second transparent electrode is formed of one selected from a group composed of ITO, IZO, ZnO, AZO, CdO, and MgO.]

[15. A fabrication method of a semiconductor light emitting device comprising:

providing a substrate;

forming an n-type semiconductor layer, a light emitting layer, a p-type semiconductor layer on the substrate;

forming a first transparent electrode having holes per a certain region on the p-type semiconductor layer; and forming a second transparent electrode on the first transparent electrode, wherein the second transparent electrode comprises a metal oxide.]

[16. The method of claim 15, wherein the second transparent electrode is formed of one selected from a group composed of ITO, IZO, ZnO, AZO, CdO, and MgO.]

[17. A fabrication method of a semiconductor light emitting device comprising:

providing a substrate;

forming an n-type semiconductor layer, a light emitting layer, and a p-type semiconductor layer on the substrate;

depositing a metal group that at least one metal oxide generating metal and at least one current spreading metal are mixed on the p-type semiconductor layer, and thereby forming a first transparent electrode;

forming a first pad on the p-type semiconductor layer;

forming holes that expose the p-type semiconductor layer per a certain region on the first transparent electrode; and forming a second transparent electrode on the first transparent electrode.]

[18. The method of claim 17, wherein the providing the substrate is performed by providing a sapphire substrate.]

[19. The method of claim 18, further comprising:

performing a mesa-etching from the p-type semiconductor layer to the n-type semiconductor layer partially in a vertical direction, and thereby exposing a part of the n-type semiconductor layer; and forming a second pad on the exposed n-type semiconductor layer.]

[20. The method of claim 17, wherein the providing the substrate is performed by providing a silicon carbide substrate.]

[21. The method of claim 20, further comprising forming a second pad on a rear surface of the silicon carbide substrate.]

[22. The method of claim 17, wherein the metal oxide generating metal is one selected from a group composed of Ni, Pd, Pt, Ir, Zn, and Mg or a mixture of at least two therebetween.]

[23. The method of claim 17, wherein the current spreading metal is Au.]

[24. The method of claim 17, wherein the holes comprise empty spaces between pillars of the first transparent electrode.]

[25. The method of claim 17, further comprising forming a second transparent electrode on the first transparent electrode.]

[26. The method of claim 17, wherein the second transparent electrode is one selected from a group composed of ITO, IZO, ZnO, AZO, CdO, and MgO.]

[27. A fabrication method of a semiconductor light emitting device comprising:

providing a substrate;

forming an n-type semiconductor layer, a light emitting layer, a p-type semiconductor layer on the substrate;

depositing a metal group that at least one metal oxide generating metal and at least one current spreading metal are mixed on the p-type semiconductor layer, and thereby forming a first transparent electrode;

forming a first pad on the p-type semiconductor layer; and forming a second transparent electrode on the first transparent electrode.]

[28. The method of claim 27, wherein the second transparent electrode is one selected from a group composed of ITO, IZO, ZnO, AZO, CdO, and MgO.]

*29. A method of fabricating a semiconductor light emitting device, the method comprising:*

*providing a substrate;*

*forming a first type semiconductor layer on the substrate;*

*forming a light emitting layer on the first type semiconductor layer;*

*forming a second type semiconductor layer on the light emitting layer;*

*forming a first transparent electrode on the second type semiconductor layer, the first transparent electrode having holes per a certain region to thereby expose the second type semiconductor layer;*

*forming a second transparent electrode on the first transparent electrode;*

*forming a first pad on the second transparent electrode; and*

*forming a second pad over the first type semiconductor layer,*

*wherein the first transparent electrode is in the shape of columns with gaps therebetween on the second type semiconductor layer,*

*wherein the first type semiconductor layer is an n-type semiconductor layer, and the second type semiconductor layer is a p-type semiconductor layer,*

*wherein the second transparent electrode completely covers the first transparent electrode and fills the gaps of the first transparent electrode, and*

*wherein the first transparent electrode includes at least one of a metal and a metal oxide.*

*30. The method of claim 29, wherein the substrate is a sapphire substrate or a silicon carbide substrate.*

*31. The method of claim 29, wherein a thickness of the first transparent electrode is approximately 1 nm-100 nm.*

*32. The method of claim 29, wherein a thickness the first type semiconductor layer is 1 μm-500 μm and a thickness of the second type semiconductor layer is 0.1 μm-100 μm.*

* * * * *